US008913441B2

United States Patent
Minz

(10) Patent No.: US 8,913,441 B2
(45) Date of Patent: Dec. 16, 2014

(54) ENHANCED GLITCH FILTER

(75) Inventor: Leonid Minz, Beer-Sheva (IL)

(73) Assignee: SanDisk Technologies, Inc., Plano, TX (US)

( * ) Notice: Subject to any disclaimer, the term of this patent is extended or adjusted under 35 U.S.C. 154(b) by 230 days.

(21) Appl. No.: 13/477,277

(22) Filed: May 22, 2012

(65) Prior Publication Data
US 2013/0314998 A1 Nov. 28, 2013

(51) Int. Cl.
*G11C 7/10* (2006.01)

(52) U.S. Cl.
USPC ........................................ 365/189.05; 365/194

(58) Field of Classification Search
CPC . G11C 29/842; G11C 21/005; G11C 16/3495
USPC ............................................ 365/189.05, 194
See application file for complete search history.

(56) References Cited

U.S. PATENT DOCUMENTS

| 6,445,229 | B1 | 9/2002 | Schenck et al. |
| 7,276,982 | B1 * | 10/2007 | Karabatsos ...................... 331/57 |
| 7,332,931 | B1 | 2/2008 | Masleid |
| 7,355,902 | B2 * | 4/2008 | Bhushan et al. ......... 365/189.05 |
| 7,557,643 | B2 | 7/2009 | Jin et al. |
| 7,564,283 | B1 | 7/2009 | Logue et al. |
| 7,894,285 | B2 | 2/2011 | Ma et al. |
| 2006/0082391 | A1 | 4/2006 | Hsu et al. |

FOREIGN PATENT DOCUMENTS

WO    WO 2012/021380 A2    2/2012

OTHER PUBLICATIONS

International Search Report and Written Opinion of the International Searching Authority, dated Sep. 18, 2013, pp. 1-10, International Application No. PCT/US2013/037914, International Searching Authority, Alexandria, Virginia, United States.

* cited by examiner

*Primary Examiner* — Son Dinh
*Assistant Examiner* — Nam Nguyen
(74) *Attorney, Agent, or Firm* — Brinks Gilson & Lione

(57) ABSTRACT

A glitch circuit includes an SR flip-flop where a received input clock is operatively coupled to set and reset inputs of the flip-flop, respectively. A configurable delay circuit receives an input signal, and an output of the delay circuit provides a delayed signal. The configurable delay circuit includes a plurality of switchable taps, each providing an increment of delay to the input signal. The delay circuit input is operatively coupled to an output of the flip flop, and an output of the delay circuit is operatively coupled to the inputs of the flip-flop. The glitch circuit captures a first signal transition of the input clock and blocks all other transitions from propagating through the flip-flop during a selected delay period so as to provide on an output of the flip-flop, the glitch-free output clock.

23 Claims, 4 Drawing Sheets

ENHANCED GLITCH FILTER

TECHNICAL FIELD

This application relates generally to the operation of non-volatile flash memory systems, and more specifically to circuits for removing noise, glitches, and double-clocking errors from a digital logic signal or clock.

BACKGROUND

When a digital logic signal or clock signal is coupled from a sending circuit to a receiving circuit, the signal can be corrupted by distortion and noise, often referred to as glitches. A glitch can cause the signal to cross the threshold between a logic zero and a logic one, causing the value of the signal to be misinterpreted by the receiving circuit.

Such glitches, including double clocking errors, may occur on the input clock of certain memory devices when data and address lines are switching at high speeds. Typically, the input clock is stable during a logic one or logic zero, but is particular susceptible to noise during the transition from high to low or low to high. Such devices may include Micro SD memory devices, SD memory devices, iNAND memory devices, and other memory devices, available from SanDisk Corp. of California. These memory devices may be susceptible to double clocking and noise glitches because of the very small space in which the memory circuits are packaged. Very small or tight package designs often cannot provide sufficient space in which to fabricate or install capacitors, or for placing shielding on the package substrate.

Memory devices, such as for example, the flash memory devices and other memory devices mentioned above, have been widely adopted for use in consumer products. Flash memory may be found in different forms, for example in the form of a portable memory card that can be carried between host devices or as a solid state drive (SSD) embedded in a host device. Two general memory cell architectures found in flash memory include NOR and NAND. In a typical NOR architecture, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells.

A typical NAND architecture utilizes strings of more than two series-connected memory cells, such as 16 or 32, connected along with one or more select transistors between individual bit lines and a reference potential to form columns of cells. Word lines extend across cells within many of these columns. An individual cell within a column is read and verified during programming by causing the remaining cells in the string to be turned on so that the current flowing through a string is dependent upon the level of charge stored in the addressed cell.

NAND flash memory can be fabricated in the form of single-level cell flash memory, also known as SLC or binary flash, where each cell stores one bit of binary information. NAND flash memory can also be fabricated to store multiple states per cell so that two or more bits of binary information may be stored. This higher storage density flash memory is known as multi-level cell or MLC flash. MLC flash memory can provide higher density storage and reduce the costs associated with the memory. The higher density storage potential of MLC flash tends to have the drawback of less durability than SLC flash in terms of the number write/erase cycles a cell can handle before it wears out. MLC can also have slower read and write rates than the more expensive and typically more durable SLC flash memory. Memory devices, such as SSDs, may include both types of memory.

With respect to memory circuits and devices, conventional de-glitch circuits typically remove glitches from a digital input signal by requiring a change in the input signal to persist for at least a predetermined time period, referred to as the de-glitching period or "glitch width," before the change is propagated to the output of the glitch filter. However, this type of glitch filter has the disadvantage of delaying the input signal by a time greater than or equal to the predetermined de-glitching period. Some digital logic circuits will not operate correctly if their input signals are subject to such delay.

Some known glitch filters use simple delay lines and combinatorial logic to filter the glitches. The main disadvantage of this approach is that the delay line is constant and sensitive to process, voltage, and temperature variations. Other known glitch filters use a Schmidt trigger with a predefined hysteresis value. However, Schmidt triggers cannot filter high amplitude glitches beyond its threshold. Still other methods use sampling by high speed clock. However, this approach is not applicable for high speed input signals, as the sampling clock must be at least ten times faster than input signal.

Known delay lines have been used to provide some degree of glitch filtering. However, due to the high frequencies of input signals and conservative duty-cycle requirements of certain memory devices, simple delay lines are not adequate because of the dependency on the silicon manufacturing process, operating voltage and temperature.

Another deficiency of known glitch filters is that they do not ensure high accuracy of the "glitch width" (pulse width to be filtered). Further, some memory devices require that the "glitch width" parameters change during operation, depending on selected speed mode of the memory device, and such simple glitch filters do not provide a selectable glitch width.

SUMMARY

A glitch filter circuit and method of operation are disclosed that removes glitches from a digital input signal without delaying the signal by the duration of the de-glitching period, and which has a selectable glitch width, and which is stable and precise relative to changes in process, voltage, and temperature. The enhanced glitch filter provides a high precision delay circuit, which may be dynamically calibrated and configurable to achieve a delay accuracy within 15%. The enhanced glitch filter addresses structural integrity issues observed as double clocking and noise on the clock input pins of certain memory devices. The enhanced glitch filter permits a first signal transition (whether input rising or falling) to propagate through the circuit, while blocking all other transitions (considered as glitches) from propagating to the output of the circuit for some period of time. The glitch filter suppresses or eliminates noise on signals during the critical rising and falling pulse transitions, when such signals are most sensitive to noise, and further, maintains the input to output delay at a constant and relatively small value, independent of the glitch width to be filtered.

Thus, according to one aspect of the invention, a glitch circuit filters glitches from a received input clock and generates a glitch-free output clock. The glitch circuit includes an SR flip-flop having a set input, a reset input, and an output, wherein the received input clock is operatively coupled to the set and reset inputs of the flip-flop, respectively. A configurable delay circuit has a delay circuit input configured to receive an input signal and a delay circuit output configured to provide a delayed signal. The configurable delay circuit includes a plurality of switchable taps, where each tap is configured to provide an increment of delay to the input signal so as to delay the input signal by a selected delay period. The delay circuit input is operatively coupled to an output of the flip-flop, and the delay circuit output is operatively coupled to the inputs of the flip-flop. The glitch circuit captures a first signal transition of the input clock and blocks all other transitions from propagating through the flip-flop during the selected delay period so as to provide on an output of the flip-flop, the glitch-free output clock.

Other methods and systems, and features and advantages thereof will be, or will become, apparent to one with skill in the art upon examination of the following figures and detailed description. It is intended that the scope of the invention will include the foregoing and all such additional methods and systems, and features and advantages thereof.

BRIEF DESCRIPTION OF THE DRAWINGS

The components in the figures are not necessarily to scale, emphasis instead being placed upon illustrating various aspects thereof. Moreover, in the figures, like referenced numerals designate corresponding parts throughout the different views.

DETAILED DESCRIPTION

Figure 1:
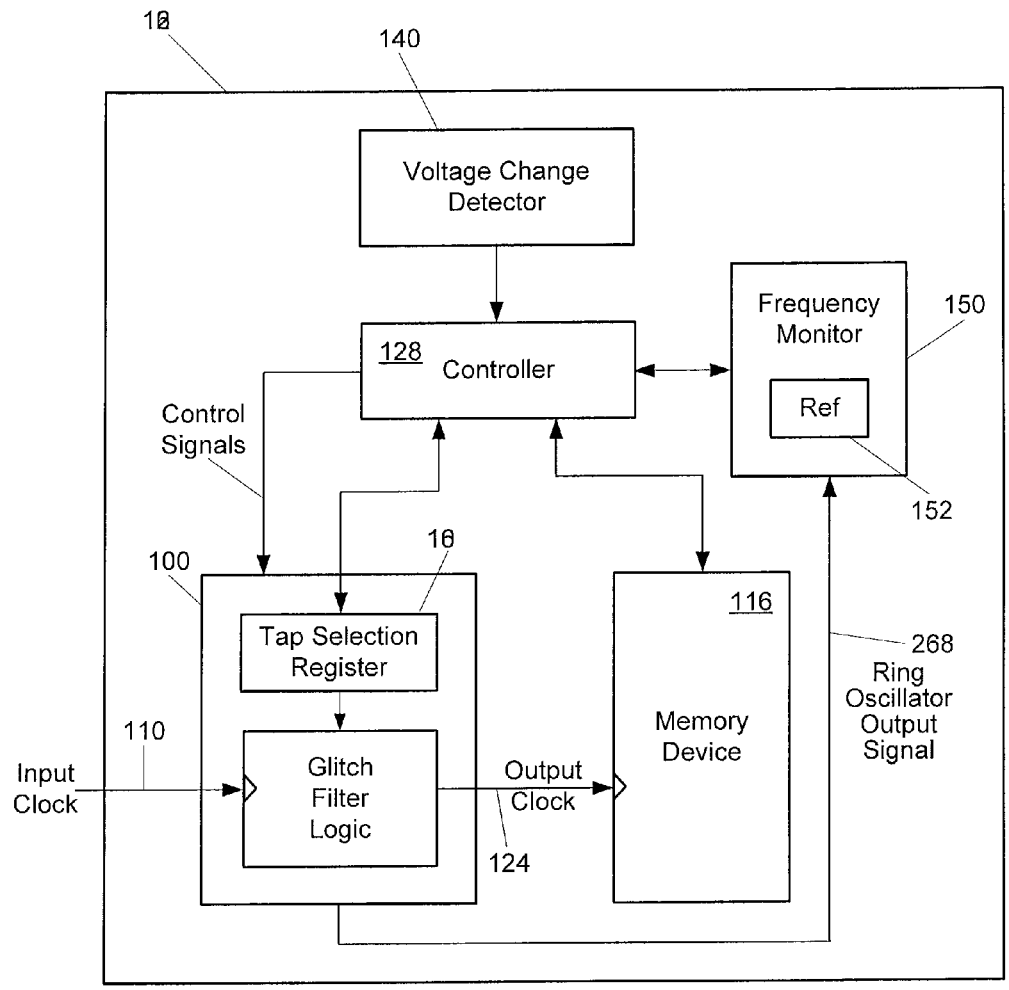
FIG. 1 is a block diagram illustrating one embodiment of a memory device and a glitch filter.

Referring to FIG. 1, a glitch filter, also interchangeably referred to as a glitch circuit 100, effectively removes or suppresses glitches or extraneous transitions on an input clock 110 of a memory device 116, and provides a glitch-free output clock 124 of high integrity to an input of the memory device 116, which memory device relies upon such a glitch-free input clock for proper functioning and timing.

The glitch filter 100 may be provided within a memory device package 126 as a front-end or embedded component coupled to the memory device 116 to provide a filter for the input clock 110. A controller 128 may be coupled to the glitch filter 100 and the memory device 116 or may be formed as part of the glitch filter and/or memory device, or may be external thereto. A voltage change detector 140 may provide notification to the controller 128 of a voltage change and/or a power-on occurrence.

Figure 2:
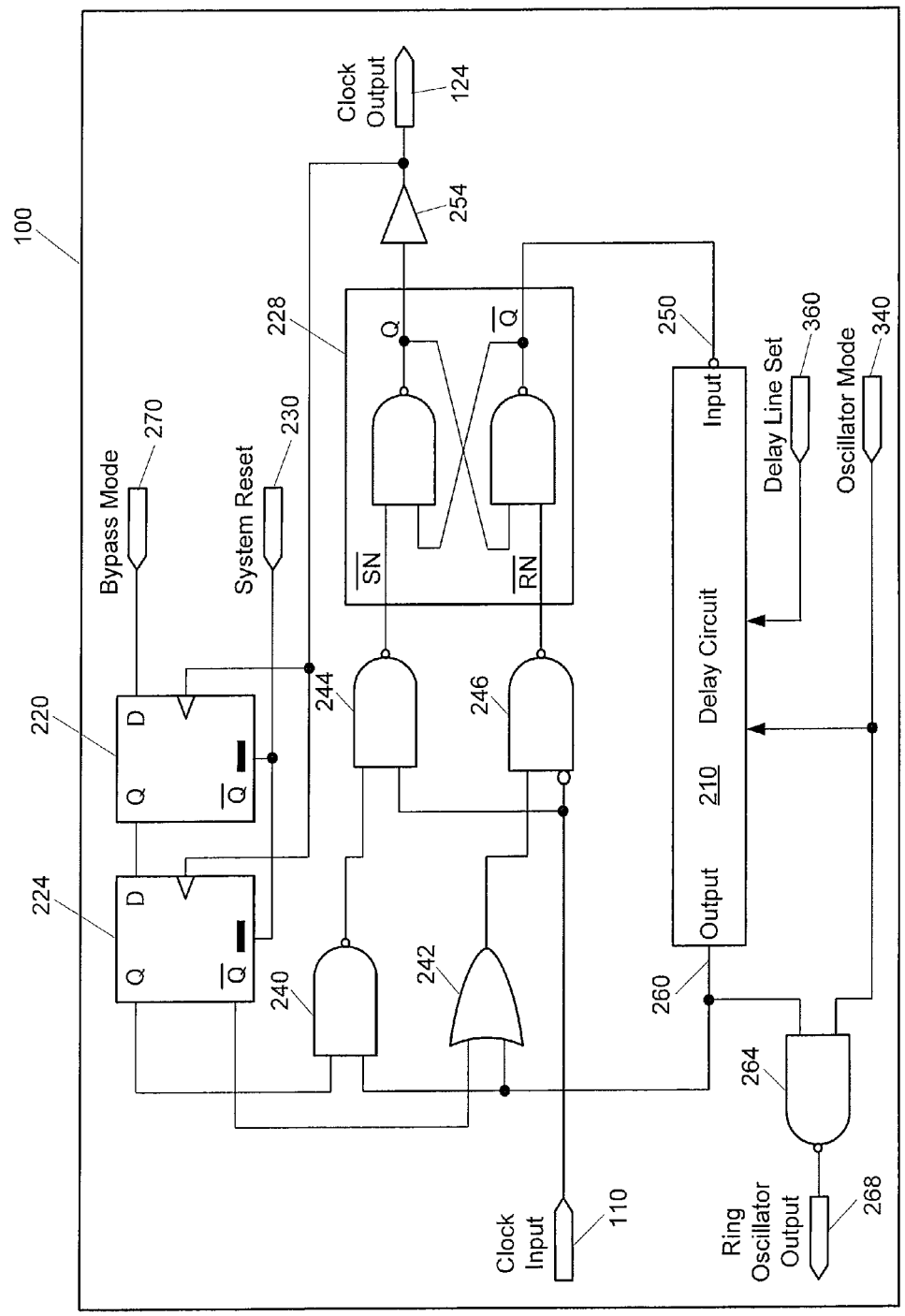
FIG. 2 is a schematic diagram of combinatorial logic of the glitch filter.

Referring to FIGS. 1 and 2, the glitch filter 100 is configured to filter induced glitches on the input clock 110 (or other digital signals) when such signals are in a transition phase (either rising or falling), and thus are more sensitive to noise. The glitch filter 100 captures a first signal transition, whether the clock signal 110 is rising or falling (depending on the polarity of the clock pulse), and blocks all other transitions, which are deemed to be glitches, from propagating to the clock output 124 for a selected period of time, as provided by a delay circuit 210. During this delay time, the input clock signal 110 can be noisy, but the output clock 124 will remain stable. After this time, the glitch filter 100 may capture the opposite signal transition.

The glitch filter 100 may operate either in a bypass mode or a filtering mode. A calibration and reconfiguration of the delay circuit 210 may be performed when the glitch filter 100 is in bypass mode. Calibration is performed any time the voltage changes and after power is initially or subsequently applied, and is only performed in bypass mode. The voltage may change after power-on in some memory devices that change voltage modes or operating voltages while operating. For example, some memory devices may operate at 1.8 volts, but may also operate at 3 volts, depending upon the host to which is it connected and the particular mode of operation. Typically, calibration is performed after each power-up cycle. During calibration, the actual delay of the delay circuit 210 is empirically measured to account for such changes in voltage, which changes in voltage generally affect the amount of delay provided.

On the other hand, reconfiguration is performed any time the clock period or other clock timing parameters of the memory device 116 change, by using the empirically measured time delays determined during calibration. In some memory devices, the clocking mode may change during operation so that a different clocking frequency is used. During the reconfiguration process, the delay circuit is programmed or configured to provide a selectable amount of delay, based on the new or desired clock parameters.

In contrast, when the glitch filter 100 operates in filtering mode, the glitch filter provides a glitch-free output clock signal 124 to the memory device 116 while the delay circuit 210 provides the requisite amount of delay previously programmed or selected during reconfiguration.

As shown in FIG. 2, the glitch filter 100 includes a first D flip-flop 220 and a second D flip-flop 224, a set-reset flip-flop (SR flip-flop) 228 with combinatorial logic, and the configurable delay line 210. When the voltage change detector 140 notifies the controller 128 of a detected change in voltage or a change in voltage operating modes, the controller 128, in turn, may control the glitch filter 100 to enter the bypass mode and perform a calibration. Similarly, if the controller 128 is informed of a clocking mode change, the controller, in turn, may control the glitch filter 100 to enter the bypass mode and perform a reconfiguration.

The first and second D flip-flops 220 and 224 provide synchronization for entering the bypass mode. The first and second D flip-flops 220 and 224 may be reset by a system reset signal 230 at power-up. The outputs of the second D flip-flop 224 are coupled to an input of a first NAND gate 240 and a first OR gate 242, respectively. An output of the first NAND gate 240 is coupled to an input of a second NAND gate 244, while the output of the first OR gate 242 is coupled to an input of a third NAND gate 246. The output of the second NAND gate 244 is coupled to a set input of the SR flip-flop 228, and the output of the third NAND gate 246 is coupled to the reset input of the SR flip-flop 228.

The $\overline{Q}$ output of the SR flip-flop 228 is connected to an input 250 of the configurable delay circuit 210, while the Q output of the SR flip-flop 228 provides the output clock signal 124 through a buffer 254. An output 260 of the configurable delay circuit 210 is coupled to the remaining inputs of the first NAND gate 240 and the first OR gate 242. The output 260 of the configurable delay circuit 210 is further coupled to an oscillator control NAND gate 264 to provide a ring oscillator output signal 268.

In the filtering mode (non-bypass mode), the glitch circuit 100 operates as follows: The SR flip-flop 228 captures a first input clock signal transition, whether such transition is low to high or high to low, and latches this signal, and keeps the signal latched, until the new output state propagates through the delay circuit 210 and back to the inputs of the SR flip-flop 228. After the signal has propagated through configurable delay circuit 210, and only after it has propagated through, the glitch filter 100 will then be able to latch a new signal state of the input clock 110.

For the implementation of the SR flip-flop 228 using NAND gates, a logic zero activates the set and reset inputs, respectively. When the SR flip-flop 228 Q output is at logic zero and the input rises ("0"→" 1") in response to receiving the input clock signal 110, the SR flip-flop 228 is set because the set input is low (active low). At this point, the SR flip-flop 228 can only be set, but cannot be cleared, because the delay circuit output 260, which is still at a logic zero, maintains the reset input high or inactive, so that any subsequent glitches at the input of the SR flip-flop 228 cannot propagate to the output. Thus, the Q output of the SR flip-flop 228 will remain at a logic one, thus "capturing" the pulse transition.

After the logic one output of the SR flip-flop 228 propagates through the delay circuit 210 and the output 260 of the delay circuit returns to logic zero, the set input of the SR flip-flop 228 will be inactive ("1"), and thus isolated from the input signal. At this time, the reset input of the SR flip-flop 228 can clear the flip-flop. At this point in time, it is assumed that input clock is stable and remains at "1" so that the SR flip-flop 228 output is still "1".

The same process happens when the input clock 110 transitions from logic high to logic low ("1"→" 0"). In this situation, the SR flip-flop 228 will be cleared so that its output is at logic zero, but cannot be set until the "0" propagates through the delay circuit 210, thus providing a stable output signal free of glitches. Generally, reference herein is made to a signal or to an output of one component operatively coupled to another device or to an input of such device. This means that the signal or output may, but need not necessarily be, directly coupled or coupled through additional devices, gates, and/or combinational components to the input of the other device.

In the bypass mode, the glitch circuit 100 operates as follows: The bypass mode is entered when the controller 128 activates a particular control signal, such as a bypass mode signal 270 (active low), which is coupled to the D input of the first D flip-flop 220. This results in a logic zero propagating to the Q output of the second D flip-flop 224 so that the output of the first NAND gate 240 is at logic one and the output of the first OR gate 242 is also at logic one. This, in turn, provides a logic one to the input of the second NAND gate 244 and the third NAND gate 246.

Accordingly, the input clock 110, which is coupled to the other input of the second 244 and third NAND gates 246, respectively, causes the input clock pulse to propagate through the SR flip-flop 228 regardless of the output state of the delay circuit 210, which thus has no effect on the remaining inputs of the first NAND gate 240 and first OR gate 242, as the clock input 110 causes the SR flip-flop 228 to toggle between the set state and the reset state based on the clock input. During bypass mode, the glitch filter 100 is not filtering the input clock 110.

Bypass mode is used to perform both calibration and reconfiguration. When any of the voltage parameters of the memory device 116 change, the controller 128 may perform calibration to measure the actual delay provided by the delay circuit 210, because a change in operating voltage inherently changes the amount of delay provided.

Figure 3:
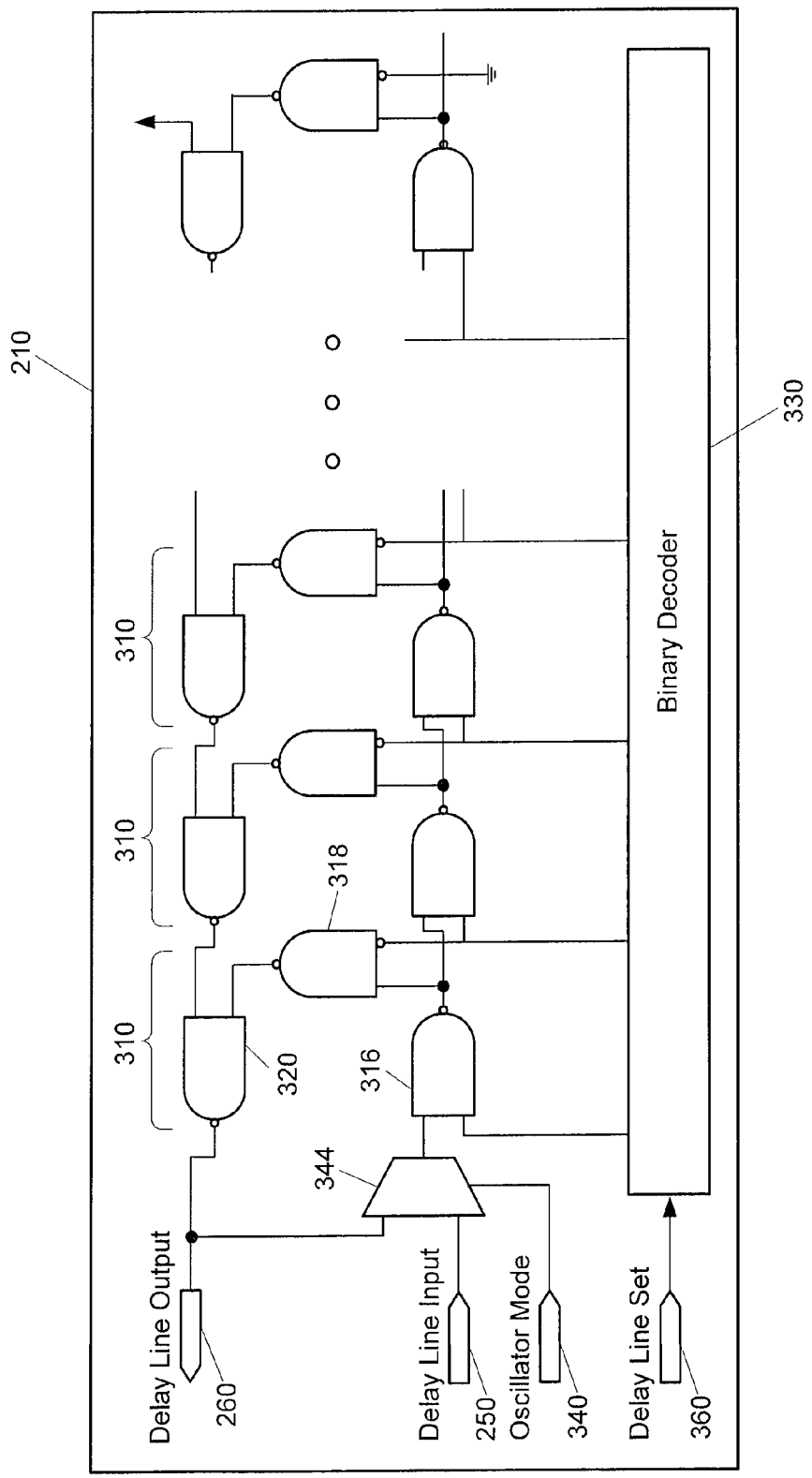
FIG. 3 is a schematic diagram of a configurable delay line of the glitch filter.

Referring to FIG. 3, the configurable delay circuit 210 may include a plurality of selectable taps 310, where each tap is configured to provide an increment of delay to its input signal so as to delay the delay line input signal 250 by a selected amount of delay. Each tap 310 may be composed of three NAND gates 316, 318, and 320, with one NAND gate 318, for example, having an inverted input. Other configurations of combinational logic may also be used. In one embodiment, there may be a maximum of 256 taps 310 in the configurable delay line 210, which is fixed at the time of manufacture, but a greater or fewer number of taps may be included in the manufactured product, depending on the application.

Based on the number of taps 310 activated, the length of the delay period can programmed for initial calibration or re-calibration. Selection of the number of taps 310 enabled is controlled by a binary decoder 330, where a logic zero in each bit position activates the corresponding tap 310. The binary decoder 330 provides a logic zero to the inverted input of the respective NAND gate so as to enable a particular tap 312.

To measure the actual amount of delay provided under the new or modified voltage parameters, the calibration mode is entered (while in bypass mode) and the controller 128 activates an oscillator mode signal 340 (logic one) to configure the delay circuit 210 as a ring oscillator. The oscillator mode signal 340 controls a multiplexer 344, which routes the delay line output 260 of the delay line 210 back into an input of the delay line via the multiplexer 344, which configures the delay circuit 210 as a ring oscillator. During this mode, the input clock signal 110 propagating through the SR flip-flop continues to supply the delay line input signal 250. Once configured as a ring oscillator, ring oscillation begins oscillating spontaneously.

The period of the ring oscillator output 268, by definition, is twice the total delay of all of the sequential components in the ring oscillator. The period of the ring oscillator output 268 may then be measured against a frequency monitor 150 having an on-chip reference clock 152 to obtain the actual value of delay. The reference clock 152 is preferably extremely stable and not subject to significant variation due to process, voltage, and temperature variations. The frequency monitor 150 and reference clock 152 is accessible by the controller 128.

For example, in one embodiment, if during calibration all of the 256 taps 310 are enabled in the delay circuit 210, the period of the ring oscillator output signal 268 is twice the delay due to all 256 taps. Thus, the average delay due to a single tap 310 is equal to the period of the ring oscillator output signal 268 divided by 512. During the calibration process, the average delay of each tap 310 is empirically determined in real time. Based on the number of desired taps, which in some embodiments, may be 64, 128, or 256, a tap selection register 160 controlled by the controller 128 may provide the appropriate instruction or word to the binary decoder 330 so as to enable the required number of taps 310 by activating a delay line set signal 360.

Once the delay circuit 210 has been calibrated, meaning that the average delay per tap delay has been empirically measured, the oscillator mode signal 340 is deactivated (logic zero) so that the multiplexer 344 causes the delay circuit 210 to function as a pure delay line rather than a ring oscillator.

Although the calibration process as described above may be performed based on a recognized change in voltage, an analogous process, referred to as reconfiguration, may be invoked when the controller 128 receives an indication that the clock frequency has changed. As described above, certain memory devices may change clock frequency during operation depending on the application, such as a double-clocking operation. Of course, as long as the voltage parameters do not change, calibration need not be performed again. The reconfiguration process may be entered so that the appropriate amount of delay, corresponding the number of taps to enable, may be programmed. Once the average the delay of a single tap 310 is known based on the calibration process, it is straightforward to enable the appropriate number of taps so as to provide a desired amount of delay.

The delay circuit 210 is variable and selectable so as to be able to handle the input clock 110 range from relatively slow input clocks to relatively fast input clocks. The variations in process, voltage, and temperature coupled with the variations in required input clock frequencies require that the delay line be stable over a range of about 300%. Although only limited by the number of taps 310 and the inherent propagation delay due to a single tap, preferable, the configurable delay circuit 210 provides a delay from about 0.2 ns to about 5 ns in some embodiments. However, this range is not absolute and may vary to provide a lesser amount of delay or a greater amount of delay, in certain embodiments. Typically, the delay period or glitch window may be selected to be about 80% of the half-period of the input clock 110. However, any suitable range of delay may be used, such as between 30% to 90% of the half-period of the input clock 110. Preferably, the delay line circuit 210 is integrally formed with the glitch filter 100, and of course is digital in nature, however, the delay line circuit 210 may be analog in nature, but would most likely require usage of a greater amount of space on the die.

During reconfiguration, the controller 128 may determine the number of taps 310 to enable so that the total delay is about equal to the desired glitch window, which as mentioned above, is about 80% of the half-period of the input clock 110 in some embodiments. Depending on the desired length, taps 310 can be added or deleted from the circuit by providing the appropriate instruction or word to the binary decoder 330. Based on a desired delay, the controller 128 may calculate the number of taps 310 to enable, as the delay per tap is known based on a previous calibration. Based on the number of desired taps 310, the controller 128 may activate the delay line set signal 360, and provide the appropriate instruction or word to the binary decoder 330 via the tap selection register 160 so as to enable the required number of taps. Once reconfigured, meaning that the desired delayed based on the per tap delay has been implemented, the bypass-mode signal 270 is deactivated by the controller 128 and the glitch circuit 100 may operate in the filtering mode.

Preferably, the delay circuit 210 has an accuracy of about 15% over the full range of temperatures from −40 C to +125 C. Thus, only the change in temperature has an effect on the delay line once operational in a particular voltage and clock mode. Changes in voltage, as mentioned above, do not affect the delay line with respect to final operation because such changes in voltage are accounted for in the calibration or recalibration process. Changes in process fabrication, which would impact known delay circuits, similarly do not affect the delay circuit 210 with respect to final operation because such changes in process are also accounted for in the calibration process.

Figure 4:
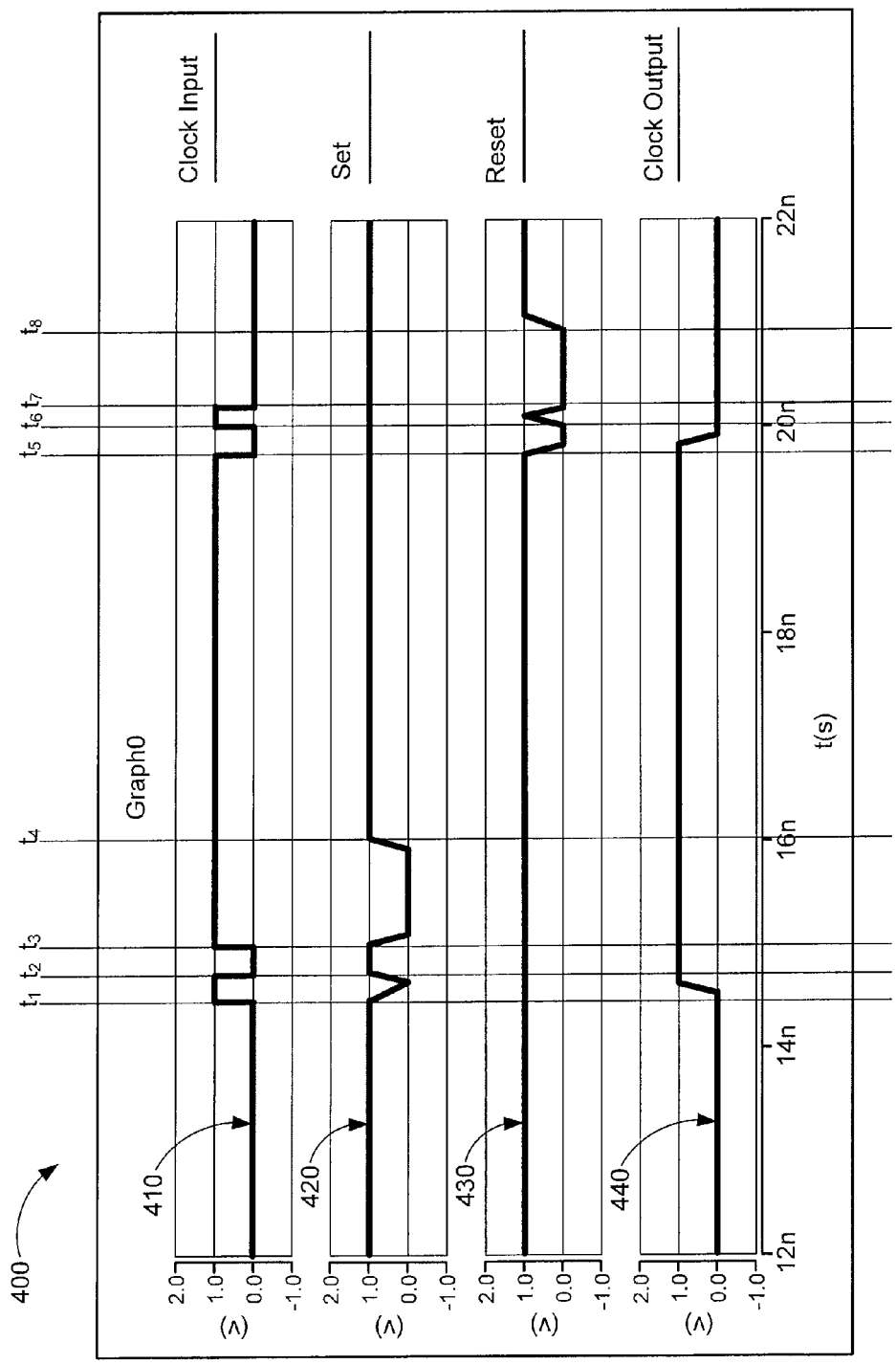
FIG. 4 shows a timing diagram.

FIG. 4 shows a timing diagram 400 with time indicated on the X axis, and voltage, shown in the Y axis. For convenience, a logic one may be shown as 1 volt and a logic zero may be shown as zero volts. A first waveform 410 shows a half cycle of the input clock 110, which may be prone to glitches, a second waveform 420 shows the state of the set input of the SR flip-flop 228, a third waveform 430 shows the state of the reset input of the SR flip-flop 228, and a fourth waveform 440 shows the state of the glitch-free output clock 124.

At time t1, the input clock pulse rising edge is shown, and the set input of the flip-flop is activated. At time t2, a glitch is shown as a falling edge, and at time t3, the glitch ends. A rising edge glitch is also shown from time t6 to time t7. During the time of the glitch from time t2 to time t3, however, the clock output remains high and is unaffected by the glitch.

When the glitch begins at time t2, the second waveform 420 shows the set input of the flip-flop is de-asserted but the reset input of the flip-flop is not active. At time t3, when the glitch ends, the set input of the flip-flop is asserted again. From time t3 to time t4, the output of the clock propagates through the delay circuit and blocks the set input of the flip-flop, while the reset input of the flip-flop is not blocked. Thus, additional glitches could occur between time t2 and t4, but would have no adverse effect. At time t4, after the output of the clock propagates through the delay circuit, the reset input of the flip-flop can again be active.

After time t4, the clock input signal may end as shown by a falling edge, which is presumed to be a valid transition, and this edge is shown as occurring at time t5 in the first waveform. Note that a falling edge on the input clock occurring after time t4 would be considered to be a valid falling edge, or in other words, the end of the clock pulse.

At time t5, the clock pulse ends, as shown by the falling edge of the clock pulse. At time t6, another glitch may occur, and this time, it is presented as a rising edge. Thus, the glitch occurs from time t6 to time t7. During this time, the set input of the flip-flop is blocked, and remains blocked until the input clock signal propagates through the delay circuit from time t7 to time t8, so as to prevent the glitch from affecting the clock output. At time t8, the clock cycle ends and another input clock pulse may begin, which coincides with time t1 and repeats thereafter.

Although the invention has been described with respect to various system and method embodiments, it will be understood that the invention is entitled to protection within the full scope of the appended claims.

The invention claimed is:

1. A glitch circuit for filtering glitches from a received input clock, the glitch circuit comprising:
    an SR flip-flop having a set input, a reset input, and an output, wherein the received input clock is operatively coupled to the set and reset inputs of the flip-flop, respectively;
    a configurable delay circuit having a delay circuit input configured to receive an input signal, and having a delay circuit output configured to provide a delayed signal;
    the configurable delay circuit having a plurality of switchable taps, each tap configured to provide an increment of delay to the input signal so as to delay the input signal by a selected delay period;
    the delay circuit input operatively coupled to an output of the flip-flop, and the delay circuit output operatively coupled to the inputs of the flip-flop; and
    wherein the glitch circuit captures a first signal transition of the input clock and blocks all other signal transitions from propagating through the flip-flop during the selected delay period so as to provide a glitch-free output clock at the output of the flip-flop.

2. The glitch circuit of claim 1, wherein the first transition of the input clock is either a rising edge of a positive clock pulse or a falling edge of a negative clock pulse.

3. The glitch circuit of claim 1, further having a bypass mode and a filtering mode.

4. The glitch circuit of claim 3, wherein when in the bypass mode, the configurable delay circuit is calibrated to measure an amount of delay provided by a plurality of delay components in the delay circuit.

5. The glitch circuit of claim 4, wherein when in the bypass mode, the configurable delay circuit is reconfigured to provide a desired amount of delay based upon the measured amount of delay.

6. The glitch circuit of claim 3, wherein the glitch filter is configured to enter the bypass mode and perform a calibration in response to a power-up condition or a detected change in operating voltage.

7. The glitch circuit of claim 1, wherein each switchable tap provides the increment of delay, and wherein a total delay of the configurable delay circuit is a sum of delays due to all taps in the delay circuit.

8. The glitch circuit of claim 7, wherein a delay of a single tap is calculated by dividing the total measured delay by a total number of enabled taps.

9. The glitch circuit of claim 5, wherein a selected number of taps are enabled to provide the desired amount of delay.

10. The glitch circuit of claim 6, wherein during calibration, the taps in the delay circuit are configured in a ring oscillator arrangement.

11. The glitch circuit of claim 3, wherein the glitch filter enters the bypass mode when a change in a desired input clock period is detected.

12. The glitch circuit of claim 3 wherein during the bypass mode, the configurable delay circuit is reconfigured to enable a selected number of taps so as to provide a predetermined amount of delay relative to a desired input clock period.

13. The glitch circuit of claim 3, wherein when in the filtering mode, the configurable delay circuit provides an amount of delay equal to about between 70% and 90% of a period of the input clock signal.

14. The glitch circuit of claim 1, wherein a period of the glitch-free output clock is substantially equal to a period of the input clock, and the period of the input clock is substantially unaffected by the amount of delay provided by the configurable delay circuit.

15. The glitch circuit of claim 1, wherein an amount of delay from the input clock to the glitch-free output clock remains substantially constant regardless of an amount of delay provided by the configurable delay circuit.

16. The glitch circuit of claim 1, wherein the plurality of switchable taps are arranged in a series configuration and the glitch circuit further comprises:
   a switchable component configured to selectively route the delay circuit output to the delay circuit input so as to configure the plurality of taps as a ring oscillator; and
   a decoder configured to enable selected taps to provide a configurable amount of delay between the input signal and the delayed signal.

17. A memory device, comprising:
   a controller;
   a non-volatile flash memory circuit operatively coupled to the controller;
   glitch circuit operatively coupled to the controller and configured to receive an input clock; and
   the glitch circuit comprising:
      an SR flip-flop having a set input, a reset input, and an output, wherein the received input clock is operatively coupled to the set and reset inputs of the flip-flop, respectively;
      a configurable delay circuit having an delay circuit input configured to receive an input signal, and having a delay circuit output configured to provide a delayed signal;
      the configurable delay circuit having a plurality of switchable taps, each tap configured to provide an increment of delay to the input signal so as to delay the input signal by a selected delay period;
      the delay circuit input operatively coupled to an output of the flip-flop, and the delay circuit output operatively coupled to the inputs of the flip-flop; and
      wherein the glitch circuit captures a first signal transition of the input clock and blocks all other signal transitions from propagating through the flip-flop during the selected delay period so as to provide a glitch-free output clock on an output of the flip-flop.

18. The memory device of claim 17, wherein the first transition of the input clock is either a rising edge of a positive clock pulse or a falling edge of a negative clock pulse.

19. The memory device of claim 17, further having a bypass mode and a filtering mode.

20. The memory device of claim 19, wherein when in the bypass mode, the configurable delay circuit is calibrated to measure an amount of delay provided by a plurality of delay components in the delay circuit.

21. The memory device of claim 20, wherein when in the bypass mode, the configurable delay circuit is reconfigured to provide a desired amount of delay based upon the measured amount of delay.

22. The memory device of claim 19, wherein the glitch filter is configured to enter the bypass mode and perform a calibration in response to a power-up condition or a change in operating voltage.

23. A method for filtering glitches from a received input clock, the method comprising:
   providing an SR flip-flop having a set input, a reset input, and an output, and operatively coupling the received input clock to the set and reset inputs of the flip-flop, respectively;
   providing a configurable delay circuit having a delay circuit input configured to receive an input signal, and having a delay circuit output configured to provide a delayed signal;
   providing the configurable delay circuit with a plurality of switchable taps, each tap configured to provide an increment of delay to the input signal so as to delay the input signal by a selected delay period;
   operatively coupling the delay circuit input to an output of the flip-flop, and operatively coupling the delay circuit output to the inputs of the flip-flop; and
   capturing, a first signal transition of the input clock and blocking all other signal transitions from propagating through the flip-flop during the selected delay period so as to provide a glitch-free output clock at the output of the flip-flop.

* * * * *